(12) United States Patent
Lee et al.

(10) Patent No.: US 11,740,551 B2
(45) Date of Patent: Aug. 29, 2023

(54) METHOD FOR PRODUCING SUBSTRATE

(71) Applicant: LG Chem, Ltd., Seoul (KR)

(72) Inventors: Jun Haeng Lee, Daejeon (KR); Yeon Keun Lee, Daejeon (KR); Jung Doo Kim, Daejeon (KR); Han Min Seo, Daejeon (KR); Cheol Ock Song, Daejeon (KR); Nam Seok Bae, Daejeon (KR)

(73) Assignee: LG Chem, Ltd.

( * ) Notice: Subject to any disclaimer, the term of this patent is extended or adjusted under 35 U.S.C. 154(b) by 0 days.

(21) Appl. No.: 16/764,685

(22) PCT Filed: Nov. 23, 2018

(86) PCT No.: PCT/KR2018/014542
§ 371 (c)(1),
(2) Date: May 15, 2020

(87) PCT Pub. No.: WO2019/103533
PCT Pub. Date: May 31, 2019

(65) Prior Publication Data
US 2020/0409253 A1     Dec. 31, 2020

(30) Foreign Application Priority Data
Nov. 24, 2017   (KR) .................. 10-2017-0158103

(51) Int. Cl.
*G03F 7/039*   (2006.01)
*G03F 7/11*    (2006.01)
(Continued)

(52) U.S. Cl.
CPC .............. *G03F 1/60* (2013.01); *G02F 1/0063* (2013.01); *G02F 1/13392* (2013.01);
(Continued)

(58) Field of Classification Search
CPC ...... G02F 1/60; G02F 1/0063; G02F 1/13392; G02F 1/13398; G03F 7/039; G03F 7/11; G03F 7/16; G03F 7/2004
See application file for complete search history.

(56) References Cited

U.S. PATENT DOCUMENTS 5,385,499 A    1/1995   Ogawa et al.
5,583,675 A *  12/1996  Yamada ............ G02F 1/133516
                                                349/110

(Continued)

FOREIGN PATENT DOCUMENTS

EP   0022311 A1   1/1981
EP   2273314 B1   7/2012
(Continued)

OTHER PUBLICATIONS

Machine translation of JP 2005-250179 (Sep. 2005).*
(Continued)

*Primary Examiner* — Martin J Angebranndt
(74) *Attorney, Agent, or Firm* — Lerner David LLP

(57) ABSTRACT

The present application relates to a method for producing a substrate which includes a step of exposing and developing a photosensitive resin composition layer formed on a surface of a substrate base layer to produce spacers. The method for producing a substrate of the present application can uniformly form spacers having a height according to a desired cell gap and can also freely control the height of the spacers.

6 Claims, 1 Drawing Sheet

(51) Int. Cl.
  *G03F 7/16*       (2006.01)
  *G03F 7/20*       (2006.01)
  *G02F 1/133*      (2006.01)
  *G03F 1/60*       (2012.01)
  *G02F 1/00*       (2006.01)
  *G02F 1/1339*     (2006.01)

(52) U.S. Cl.
  CPC .............. *G03F 7/039* (2013.01); *G03F 7/11* (2013.01); *G03F 7/16* (2013.01); *G03F 7/2004* (2013.01); *G02F 1/13398* (2021.01)

(56) References Cited

U.S. PATENT DOCUMENTS

| | | | | |
|---|---|---|---|---|
| 6,133,972 | A * | 10/2000 | Fujimori | G02F 1/133377 349/86 |
| 6,208,402 | B1 * | 3/2001 | Tajima | G02F 1/13394 349/174 |
| 6,221,543 | B1 * | 4/2001 | Guehler | G02F 1/133516 430/7 |
| 6,299,949 | B1 | 10/2001 | Shioda et al. | |
| 6,433,852 | B1 * | 8/2002 | Sonoda | G02F 1/134363 349/141 |
| 6,501,527 | B1 * | 12/2002 | Hirose | G02F 1/13394 349/155 |
| 6,870,592 | B1 | 3/2005 | Yamamoto et al. | |
| 2002/0060771 | A1 | 5/2002 | Sumino et al. | |
| 2002/0114169 | A1 * | 8/2002 | Harada | G02B 6/0051 362/333 |
| 2003/0094691 | A1 * | 5/2003 | Auch | H01L 51/5246 257/704 |
| 2003/0152849 | A1 * | 8/2003 | Chan-Park | G02F 1/133305 430/394 |
| 2005/0074653 | A1 * | 4/2005 | Broman | H01M 10/36 429/493 |
| 2011/0008611 | A1 * | 1/2011 | Shiraishi | G03F 7/0047 428/323 |
| 2012/0274004 | A1 * | 11/2012 | Kobrin | B82Y 40/00 264/496 |
| 2012/0282554 | A1 * | 11/2012 | Kobrin | G03F 7/70358 430/326 |
| 2013/0089734 | A1 * | 4/2013 | Nakamura | B32B 15/082 428/339 |
| 2015/0064628 | A1 * | 3/2015 | Guo | G03F 7/30 430/319 |
| 2015/0260907 | A1 * | 9/2015 | Yang | B65D 65/14 362/606 |
| 2017/0199411 | A1 * | 7/2017 | Kim | H01L 27/1222 |
| 2018/0329286 | A1 * | 11/2018 | Hwang | G03F 7/70791 |

FOREIGN PATENT DOCUMENTS

| | | | |
|---|---|---|---|
| JP | 58-160927 | * | 9/1983 |
| JP | H05205640 | A | 8/1993 |
| JP | 2923031 | B2 | 7/1999 |
| JP | 2000171804 | A | 6/2000 |
| JP | 2000214470 | A * | 8/2000 |
| JP | 2000214470 | A | 8/2000 |
| JP | 2001005006 | A | 1/2001 |
| JP | 2001083524 | A | 3/2001 |
| JP | 2001226449 | A * | 8/2001 |
| JP | 2002179993 | A | 6/2002 |
| JP | 2005140993 | A | 6/2005 |
| JP | 2005-250179 | * | 9/2005 |
| JP | 2005258137 | A * | 9/2005 |
| JP | 2006154593 | A | 6/2006 |
| JP | 2007148005 | A | 6/2007 |
| JP | 2010145756 | A | 7/2010 |
| JP | 2011170075 | A | 9/2011 |
| JP | 2014038345 | A | 2/2014 |
| KR | 20100124805 | A | 11/2010 |
| KR | 20160063125 | A | 6/2016 |
| WO | 2009116258 | A1 | 9/2009 |

OTHER PUBLICATIONS

Machine translation of Kondo et al. (1983).*
International Search Report for PCT/KR2018/014542 dated Feb. 26, 2019; 2 pages.

* cited by examiner

[Figure 1]
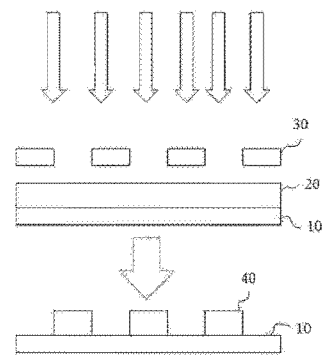
[Figure 2]
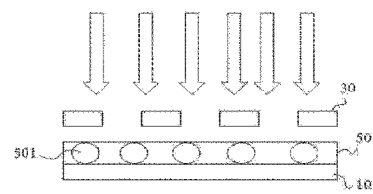
[Figure 3]
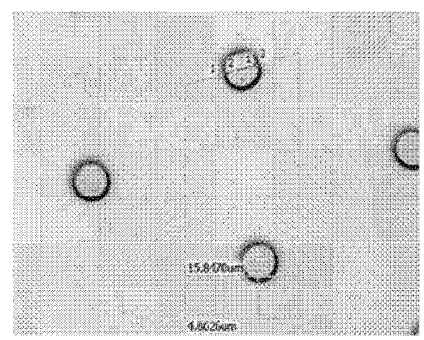
[Figure 4]
| L1 | C1 | R1 |
| L2 | C2 | R2 |
| L3 | C3 | R3 |

METHOD FOR PRODUCING SUBSTRATE

CROSS-REFERENCE TO RELATED APPLICATIONS

The present application is a national phase entry under 35 U.S.C. § 371 of International Application No. PCT/KR2018/014542 filed on Nov. 23, 2018, which claims priority to Korean Patent Application No. 10-2017-0158103 filed on Nov. 24, 2017, the disclosures of which are incorporated herein by reference in their entirety.

TECHNICAL FIELD

The present application relates to a method for producing a substrate.

BACKGROUND ART

An optical device capable of adjusting light transmittance or colors by disposing a liquid crystal compound or the like between two substrates disposed opposite to each other is known. For example, Patent Document 1 has disclosed a so-called GH cell (guest host cell) applying a mixture of a liquid crystal host and a dichroic dye guest. In such a device, so-called spacers are located between the above-described two substrates to maintain the spacing between the substrates.

As the spacer, a so-called ball (or bead) spacer and a column spacer have been typically used. The column spacer is a form fixed on a substrate, which has been generally formed by exposing and developing a photosensitive resin. For example, as shown in FIG. 1, after forming a photosensitive resin composition layer (20) on a substrate base layer (10), the spacer (40) is formed on the substrate base layer (10) by a method of irradiating it with light (arrow) via a mask (30) and then removing exposed portions or unexposed portions.

PRIOR ART DOCUMENTS

Patent Documents

Patent Document 1: European Patent Publication No. 0022311

DISCLOSURE

Technical Problem

The present application relates to a method for producing a substrate, for example, a substrate comprising spacers.

It is one object of the present application to provide a method for producing a substrate in which spacers can be uniformly formed to maintain a uniform cell gap at the time of manufacturing an element and the range of the cell gap can also be freely controlled depending on to the purpose.

Technical Solution

The method for producing a substrate of the present application comprises a step of exposing and developing a photosensitive resin composition layer formed on a surface of a substrate base layer to produce spacers.

In the production method of the present application, a layer of a photosensitive resin composition comprising a photosensitive resin and beads is used as the photosensitive resin composition layer in the above exposure and development process. In one example, as schematically shown in FIG. 2, the photosensitive resin composition layer (50) on the substrate base layer (10) to be exposed via a mask (30) may comprise beads (501) together with the photosensitive resin. By applying the beads in this way, the height of the entire photosensitive resin composition layer region can be uniformly maintained during the exposure and development process of the photosensitive resin composition layer. As a result, the method for producing a substrate according to the present application can form spacers having a uniform height on the substrate base layer. In addition, by controlling the size and/or the ratio of the beads, the size (height) of the spacer can be freely controlled according to a desired cell gap, and even if the spacers having a high height are produced, the spacers may also be produced to have a uniform height. The beads present in the photosensitive resin layer may be removed in the developing process following the exposing process, or may remain in the spacers.

As the substrate base layer, for example, any base layer used in a substrate in a configuration of a known optical device such as an LCD (liquid crystal display) can be applied without particular limitation. For example, the substrate base layer may be an inorganic base layer or an organic base layer. As the inorganic base layer, a glass base layer or the like can be exemplified, and as the organic base layer, various plastic films or the like can be exemplified. The plastic film can be exemplified by a TAC (triacetyl cellulose) film; a COP (cycloolefin copolymer) film such as a norbornene derivative; an acrylic film such as PMMA (poly(methyl methacrylate)); a PC (polycarbonate) film; a polyolefin film such as PE (polyethylene) or PP (polypropylene); a PVA (polyvinyl alcohol) film; a DAC (diacetyl cellulose) film; a Pac (polyacrylate) film; a PES (polyether sulfone) film; a PEEK (polyetheretherketone) film; a PPS (polyphenylsulfone) film, a PEI (polyetherimide) film; a PEN (polyethylene naphthatate) film; a PET (polyethyleneterephtalate) film; a PI (polyimide) film; a PSF (polysulfone) film or a PAR (polyarylate) film, and the like, but is not limited thereto.

In the substrate of the present application, the thickness of the base layer is also not particularly limited, where an appropriate range may be selected depending on applications.

In the present application, other elements required for driving an optical device may also be formed on the applied substrate base layer, in addition to the photosensitive resin composition layer. These elements are variously known, and typically, there is an electrode layer or a light shielding layer, and the like. The electrode layer or the light shielding layer may be formed, for example, between the base layer and the photosensitive resin composition layer. As the electrode layer, a known material can be applied. For example, the electrode layer may comprise a metal alloy, an electrically conductive compound or a mixture of two or more thereof. Such a material can be exemplified by a metal such as gold, CuI, an oxide material such as ITO (indium tin oxide), IZO (indium zinc oxide), ZTO (zinc tin oxide), zinc oxide doped with aluminum or indium, magnesium indium oxide, nickel tungsten oxide, ZnO, $SnO_2$ or $In_2O_3$, a metal nitride such as gallium nitride, a metal selenide such as zinc selenide, a metal sulfide such as zinc sulfide, or the like. A transparent positive hole injecting electrode layer can also be formed by using a laminate of a metal thin film of Au, Ag or Cu, and the like, and a transparent material having high refractive index such as ZnS, $TiO_2$ or ITO.

The electrode layer may be formed by any means such as vapor deposition, sputtering, chemical vapor deposition or electrochemical means. Patterning of the electrode layer is also possible in a known manner without any particular limitation, and the electrode layer may be patterned, for example, through known photolithography or a process using a shadow mask or the like.

As the light shielding layer, a known material may also be applied, and for example, the layer may be exemplified by a metal layer, a metal oxide layer, a metal nitride layer or a metal oxynitride layer, which is generally applied, or a layer containing an organic pigment and/or an inorganic pigment, and the like.

The method of forming a photosensitive resin composition layer on such a substrate base layer is not particularly limited. In the present application, the photosensitive resin composition layer can be formed by coating a coating liquid formed by blending known additives in a photosensitive resin, if necessary, on a substrate base layer to an appropriate thickness, as performed in a general column spacer manufacturing process, but using a coating liquid containing beads in the coating liquid.

At this time, also, the kind of the applicable photosensitive resin is not particularly limited, where a known photosensitive resin may be used. Generally, a material of a type that is cured by irradiation with light such as ultraviolet rays is used, and as an example thereof, an epoxy resin, an acrylic resin, an oxetane resin or a thiol-ene resin (resin using thiol-ene reaction of a thiol and a vinylic compound), and the like are known, but the kinds of materials that can be applied in the present application are not limited thereto.

On the other hand, in the present application, the range of the term photosensitive resin may include monomer or oligomer components that can be cured or crosslinked by light irradiation or the like to become a resin component, as well as components themselves in resin form.

The ratio of the photosensitive resin in the photosensitive resin composition layer is not particularly limited. In one example, the ratio of the photosensitive resin in the photosensitive resin composition may be about 50 wt % or more, 55 wt % or more, 60 wt % or more, 65 wt % or more, 70 wt % or more, 75 wt % or more, 80 wt % or more, 85 wt % or more, or 90 wt % or more or so. The upper limit of the ratio is not particularly limited, and for example, the ratio of the photosensitive resin may be less than about 100 wt %, 95 wt % or less, or 90 wt % or less or so.

Beads are contained in the photosensitive resin composition layer together with the photosensitive resin. By applying the beads, spacers having a uniform height can be easily manufactured depending on the desired height.

The shape of the beads to be contained is not particularly limited. That is, as long as the height of the photosensitive resin composition layer or the spacers can be uniformly maintained during the exposure and development process and the like depending on to the purpose of the present application, all the beads having various shapes can be applied.

For example, the bead may have a spherical shape, a columnar shape, a polygonal shape or an amorphous shape, where in the case of the columnar shape, a cylinder shape, an elliptic cylinder shape, or a polygonal column shape such as a square column shape, and the like can also be used.

The size of the beads can be determined by the height of the spacer according to the desired cell gap.

In one example, the beads may have a size in a range of about 1 μm to 50 μm. The size may be the particle diameter when the bead is a spherical shape, the height when the bead is a columnar shape and the largest or smallest size when the bead is a polygonal shape or other shapes.

In another example, the size of the beads may be 2 μm or more, 2.5 μm or more, 3 μm or more, 3.5 μm or more, 4 μm or more, 4.5 μm or more, 5 μm or more, 5.5 μm or more, 6 μm or more, 6.5 μm or more, 7 μm or more, 7.5 μm or more, 8 μm or more, 8.5 μm or more, 9 μm or more, 9.5 μm or more, or 10 μm or more, or may be 45 μm or less, 40 μm or less, 35 μm or less, 30 μm or less, 25 μm or less, 20 μm or less, or 15 μm or less, but this size may be changed depending on the purpose. The beads to be added to the photosensitive resin composition layer may be required to have a uniform size distribution from the viewpoint of forming spacers having a uniform height.

The material of the beads applied in the present application is not particularly limited, and known organic or inorganic beads can be used. For example, beads of polymeric materials such as acrylic beads, silicone beads, urethane beads, polystyrene beads or epoxy beads, or inorganic beads such as silica beads, talc beads or zeolite beads can be used.

The photosensitive resin composition layer may comprise 0.01 to 10 parts by weight of beads relative to 100 parts by weight of the photosensitive resin. At this time, the ratio of the beads added can be changed depending on the purpose, which can be adjusted in consideration of, for example, the height uniformity according to the desired height of the spacers, and the like.

The photosensitive resin composition layer may comprise other known components in addition to the photosensitive resin and the beads. At this time, the components that may be contained include, for example, crosslinking agents, initiators, pigments, surfactants, leveling agents, and the like, but are not limited thereto. Among the above components, the pigment may be included, for example, when formation of black spacers is required depending on the purpose.

The thickness of such a photosensitive resin composition layer is not particularly limited, which may be adjusted depending on the purpose. For example, the thickness of the composition layer may be in a range of about 1 μm to 50 μm.

In another example, the thickness may be 2 μm or more, 2.5 μm or more, 3 μm or more, 3.5 μm or more, 4 μm or more, 4.5 μm or more, 5 μm or more, 5.5 μm or more, 6 μm or more, 6.5 μm or more, 7 μm or more, 7.5 μm or more, 8 μm or more, 8.5 μm or more, 9 μm or more, 9.5 μm or more, or 10 μm or more, or may be 45 μm or less, 40 μm or less, 35 μm or less, 30 μm or less, 25 μm or less, 20 μm or less, or 15 μm or less, but this size may be changed depending on the purpose.

The production method of the present application comprises a process of exposing a photosensitive resin composition layer containing such components. At this time, the exposure process is not particularly limited and may be performed according to a known method, for example, a method of exposing it by irradiating it with ultraviolet rays.

For example, as illustratively shown in FIG. 2, the exposure step may be performed by irradiating the photosensitive resin composition layer (50) with light via a mask (30).

There is no particular limitation on the type and pattern of the mask applied in this process, and a well-known mask used for manufacturing the column spacer can be used, and the pattern can also be determined according to the desired pattern of the spacer.

In the drawing, the mask (30) is irradiated with light at a position where it is separated by a certain distance from the photosensitive resin composition layer (50), but in some cases, the exposure process may also be performed in a state where the mask is in contact with the photosensitive resin composition layer.

In addition, the intensity or wavelength of the light to be exposed is not particularly limited, which can be controlled depending on to the type of the applied photosensitive resin.

In the production method of the present application, the developing process may be performed after the exposure process. The developing process is a process of selectively removing the exposed region or the unexposed region of the photosensitive resin composition layer. The spacers thus formed may also comprise the photosensitive resin, and may also further comprise the beads in the photosensitive resin. This developing process can be performed according to a known method, and for example, can be performed by treating the substrate with a suitable developer depending on the type of the photosensitive resin used.

Also, following the above processes, the method for producing a substrate of the present application may further comprise a step of forming an alignment film on the substrate base layer comprising the formed spacers.

At this time, the kind of the alignment film to be formed and the forming method thereof are not particularly limited, and a known alignment film, for example, a known rubbing alignment film or photo alignment film, may be formed in a known manner. That is, a method of forming the alignment film on the base layer and the spacers and performing the orientation treatment thereon also follows a known method.

In one example, the production of such a substrate may be performed by a roll-to-roll method. In this method, the formation of the photosensitive resin composition layer, the exposure and development process, and the like can be performed while releasing and moving the substrate base layer wound on a roll such as a winding roll. After such a process, the substrate base layer can be wound on the winding roll, where the movement path of the base layer can be controlled by a guide roll or the like. Specifically, the method for carrying out the roll-to-roll process is not particularly limited, which can be performed according to a known method.

The present application also relates to an optical device formed using such a substrate.

An exemplary optical device of the present application may comprise the substrate and a second substrate disposed opposite to the substrate and maintaining a gap with the substrate by the spacer in the substrate.

In the optical device, a light modulation layer may be present in a gap between two substrates. In the present application, the term light modulation layer may include all known types of layers capable of changing at least one characteristic among characteristics such as polarization states, transmittance, color tones and reflectance of incident light depending on purposes.

For example, the light modulation layer is a layer comprising a liquid crystal material, which may be a liquid crystal layer switched between a diffusion mode and a transparent mode by on-off of a voltage, for example, a vertical electric field or a horizontal electric field, a liquid crystal layer switched between a transparent mode and a blocking mode, a liquid crystal layer switched between a transparent mode and a color mode, or a liquid crystal layer switched between color modes of different colors.

The light modulation layers capable of performing the actions as above, for example, liquid crystal layers, are variously known. As one exemplary light modulation layer, a liquid crystal layer used in a typical liquid crystal display can be used. In another example, the light modulation layer may also be various types of so-called guest host liquid crystal layers, polymer dispersed liquid crystal layers, pixel-isolated liquid crystal layers, suspended particle devices or electrochromic devices, and the like.

The polymer dispersed liquid crystal layer (PDLC) is a superordinate concept including a PILC (pixel isolated liquid crystal), a PDLC (polymer dispersed liquid crystal), a PNLC (polymer network liquid crystal) or a PSLC (polymer stabilized liquid crystal), and the like. The polymer dispersed liquid crystal layer (PDLC) may comprise, for example, a liquid crystal region containing a polymer network and a liquid crystal compound dispersed in a state of being phase-separated from the polymer network.

The implementation manner or form of the light modulation layer is not particularly limited, and any known method may be employed without any limitation depending on purposes.

In addition, the optical device may further comprise additional known functional layers, such as a polarizing layer, a hard coating layer and/or an antireflection layer, if necessary.

Advantageous Effects

The method for producing a substrate of the present application can uniformly form spacers having a height according to a desired cell gap and can also freely control the height of the spacers.

BRIEF DESCRIPTION OF DRAWINGS

FIG. 1 is a diagram showing a known spacer production method.

FIG. 2 is a diagram showing an exemplary method for producing spacers of the present application.

FIG. 3 is a photograph of the spacers formed in an example.

FIG. 4 is a diagram showing points where the height of the spacers formed in an example is measured.

MODE FOR INVENTION

Hereinafter, the present application will be specifically described by way of examples, but the scope of the present application is not limited by the following examples.

Example 1

A crystalline ITO (indium tin oxide) electrode layer was formed on a square PET (polyethylene terephthalate) base layer (10 in FIG. 2) having a diagonal length of 55 inches as a substrate base layer, and spacers were formed thereon. The spacers were formed by using, as a photosensitive resin composition, a photosensitive resin composition obtained by mixing organic beads (spherical acrylic beads as a mixture of polystyrene and polymethyl methacrylate) having a size (particle diameter) of about 10 μm or so with a mixture (UV resin) of a conventional UV-curing acrylate series binder (mixture comprising a trimethylolpropane tricarylate monomer and an isobornyl acrylate monomer as main components) and initiator (a mixture of Darocur TPO and Darocur 1173 from Ciba Co., Ltd.) in a ratio of about 2 parts by weight relative to 100 parts by weight of the UV resin. The composition was coated on the ITO electrode layer of the PET base layer to a thickness of approximately 10 μm or so, and the composition was cured by irradiating it with ultraviolet rays in a state where a light shielding pattern mask was in contact with the composition layer. Thereafter, the uncured photosensitive resin composition layer was removed (developed) using IPA (isopropyl alcohol) to form spacers. FIG. 3 is a photograph of the spacers thus formed. Among the spacers thus formed, the heights of the spacers formed at the points (L1 to L3, C1 to C3 and R1 to R3) as shown in FIG. 4 were measured. The heights were measured using a 3D Laser Scanning Microscope (Keyence, VK-X210, ×1,000 magnification) and shown in Table 1 below. The respective points shown in FIG. 4 are three points selected from the middle, right side and left side, respectively at approximately equal intervals on the surface of the PET base layer.

Comparative Example 1

The spacers were prepared in the same manner as in Example 1, except that a photosensitive resin composition not containing beads was used, and the size at each point was measured and shown in Table 1 below.

TABLE 1

| | Example (height unit: μm) | | | Comparative Example (height unit: μm) | | |
|---|---|---|---|---|---|---|
| | L point | C point | R point | L point | C point | R point |
| 1 | 9.7 | 9.8 | 9.7 | 8.0 | 7.6 | 7.4 |
| 2 | 9.8 | 9.7 | 9.7 | 8.0 | 8.6 | 8.3 |
| 3 | 9.9 | 9.8 | 9.8 | 6.9 | 7.3 | 7.3 |

EXPLANATION OF REFERENCE NUMERALS

10: substrate base layer
20, 50: photosensitive resin composition layer
30: mask
40: spacer
501: bead

The invention claimed is:

1. A method for producing a substrate consisting of exposing and developing a photosensitive resin composition layer formed on a surface of a substrate base layer to produce a spacer,
   wherein the photosensitive resin composition layer formed on the surface of the substrate base layer consists of a photosensitive resin and beads,
   wherein the beads consist of acrylic beads, silicone beads, silica beads, talc beads, urethane beads, epoxy beads, zeolite beads or polystyrene beads, having
   a shape selected from the group consisting of a spherical shape, a columnar shape, a polygonal shape, and an amorphous shape,
   wherein the beads consist of beads having a size in a range of 1 μm to 50 μm, and the size is equal to a height of the spacer,
   wherein the method is performed by a roll-to-roll process,
   wherein the spacer formed using the photosensitive resin composition layer consists of the photosensitive resin and the beads, and
   wherein the exposing is performed in a state where a mask is in contact with the photosensitive resin composition layer.

2. The method for producing a substrate according to claim 1, wherein the photosensitive resin is an epoxy resin, an acrylic resin, an oxetane resin, or a thiol-ene resin.

3. The method for producing a substrate according to claim 1, wherein the photosensitive resin composition layer comprises 0.01 to 10 parts by weight of the beads relative to 100 parts by weight of the photosensitive resin.

4. The method for producing a substrate according to claim 1, wherein an electrode layer is formed between the substrate base layer and the photosensitive resin composition layer.

5. The method for producing a substrate according to claim 1, wherein a light shielding layer is formed between the substrate base layer and the photosensitive resin composition layer.

6. The method for producing a substrate according to claim 1, further comprising forming an alignment film after the production of the spacers.

* * * * *